(12) United States Patent
Callegari et al.

(10) Patent No.: US 8,288,237 B2
(45) Date of Patent: Oct. 16, 2012

(54) TIC AS A THERMALLY STABLE P-METAL CARBIDE ON HIGH K $SIO_2$ GATE STACKS

(75) Inventors: Alessandro C. Callegari, Yorktown Heights, NY (US); Michael A. Gribelyuk, Stamford, CT (US); Dianne L. Lacey, Mahopac, NY (US); Fenton R. Feeney, Ossining, NY (US); Katherine L. Saenger, Ossining, NY (US); Sufi Zafar, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 342 days.

(21) Appl. No.: 12/541,575

(22) Filed: Aug. 14, 2009

(65) Prior Publication Data

US 2010/0015790 A1    Jan. 21, 2010

Related U.S. Application Data

(62) Division of application No. 11/034,597, filed on Jan. 13, 2005, now Pat. No. 7,667,277.

(51) Int. Cl.
*H01L 21/336* (2006.01)
(52) U.S. Cl. ........ 438/305; 438/585; 438/591; 438/592; 257/E21.43
(58) Field of Classification Search .................. 438/592, 438/591, 585, 305; 257/E21.43
See application file for complete search history.

(56) References Cited

U.S. PATENT DOCUMENTS

| | | | |
|---|---|---|---|
| 5,470,661 A * | 11/1995 | Bailey et al. | 428/408 |
| 5,523,588 A | 6/1996 | Nishimura et al. | |
| 5,965,911 A | 10/1999 | Joo et al. | |
| 6,020,024 A | 2/2000 | Maiti et al. | |
| 6,388,272 B1 | 5/2002 | Odekirk | |
| 6,465,335 B1 | 10/2002 | Kunikiyo | |
| 6,893,927 B1 | 5/2005 | Shah et al. | |
| 7,030,430 B2 | 4/2006 | Doczy et al. | |
| 7,074,680 B2 | 7/2006 | Doczy et al. | |
| 2003/0164527 A1 | 9/2003 | Sugi et al. | |
| 2004/0188762 A1 | 9/2004 | Shimamoto et al. | |

(Continued)

FOREIGN PATENT DOCUMENTS

| CN | 1551300 A | 12/2004 |
|---|---|---|
| JP | 7015014 | 8/2009 |

OTHER PUBLICATIONS

Extened European Search Report dated Sep. 11, 2009, 10 pages.

*Primary Examiner* — Michael Trinh
(74) *Attorney, Agent, or Firm* — Scully, Scott, Murphy & Presser, P.C.; Louis J. Percello, Esq.

(57) ABSTRACT

A compound metal comprising TiC which is a p-type metal having a workfunction of about 4.75 to about 5.3, preferably about 5, eV that is thermally stable on a gate stack comprising a high k dielectric and an interfacial layer is provided as well as a method of fabricating the TiC compound metal. Furthermore, the TiC metal compound of the present invention is a very efficient oxygen diffusion barrier at 1000° C. allowing very aggressive equivalent oxide thickness (EOT) and inversion layer thickness scaling below 14 Å in a p-metal oxide semiconductor (pMOS) device.

14 Claims, 5 Drawing Sheets

U.S. PATENT DOCUMENTS

| | | |
|---|---|---|
| 2004/0191151 A1 | 9/2004 | Kouvetakis et al. |
| 2004/0222474 A1 | 11/2004 | Chau et al. |
| 2005/0081781 A1 | 4/2005 | Lin et al. |
| 2005/0101113 A1 | 5/2005 | Brask et al. |
| 2005/0142463 A1* | 6/2005 | Mitsui et al. ............... 430/5 |
| 2006/0051880 A1 | 3/2006 | Doczy et al. |

* cited by examiner

TIC AS A THERMALLY STABLE P-METAL CARBIDE ON HIGH K SIO₂ GATE STACKS

CROSS REFERENCE TO RELATED APPLICATIONS

This application is a divisional application of U.S. Ser. No. 11/034,597, filed on Jan. 13, 2005. The entire content of the aforementioned U.S. Application is incorporated herein by reference.

DESCRIPTION

FIELD OF THE INVENTION

The present invention relates to a semiconductor device and a method of fabricating the same. More particularly, the present invention relates to a complementary metal oxide semiconductor (CMOS) device which includes a thermally stable p-type metal carbide on a high dielectric constant, k/interfacial layer stack. The present invention also provides a process for forming the thermally stable p-type metal carbide which can be integrated with a CMOS processing flow.

BACKGROUND OF THE INVENTION

In standard CMOS devices, polysilicon is typically the standard gate material. The technology of fabricating CMOS devices using polysilicon gates has been in a constant state of development, and is now widely used in the semiconductor industry. One advantage of using polysilicon gates is that they can sustain high temperatures. However, there are also some problems associated with using a polysilicon gate. For example, due to the poly-depletion effect and relative high electrical sheet resistance (approximately 150 Ohms/Sq.), polySi gates commonly used in CMOS devices are becoming a gating factor in chip performance for channel lengths of 0.1 micron and below. Another problem with polySi gates is that the dopant in the polySi gate, such as boron, can easily diffuse through the thin gate dielectric causing further degradation of the device performance.

In order to avoid the problems with polySi gates, it has been suggested to replace the polySi gate with a single metal. Although such technology has been suggested, single metals are not thermally stable on a high k (dielectric constant greater than about 4.0)/interfacial layer gate stack. For example, tungsten, W, and rhenium, Re have stability problems at 1000° C. Tungsten shows interfacial $SiO_2$ regrowth at 4-5 Å after 1000° C., 5 second anneal limiting device scaling and Re is not stable on a high k gate stack, leading to device (mobility) degradation. See, for example, A. Callegari, et al., IEDM 2004, p. 825, S. Francisco Calif., Dec. 13-15, 2004 and Narayanan, et al., VLSI Digest 2004, Hawaii June 2004.

Stability at 1000° C. is required to activate the source/drain implant in self-aligned metal oxide semiconductor field effect transistors (MOSFETs). Also, it has been reported that high electron mobilities are obtained when performing a high temperature anneal. See, for example, A. Callegari, et al., IEDM 2004, p. 825, S. Francisco Calif., Dec. 13-15, 2004. Metal nitrides such as TiN have been extensively used to improve the metal/high k thermal stability. However, most of the work reported on TiN shows that TiN is a mid-gap material which may have limited device performance.

In view of the above, there is a need for providing a new compound metal which is thermally stable on a gate stack including a high k dielectric. In particular, there is a need for providing a new compound metal useful in pFET devices.

SUMMARY OF THE INVENTION

The present invention provides a new compound metal comprising TiC which is a p-type metal having a workfunction of about 4.75 to about 5.3, preferably about 5, eV which is thermally stable on a gate stack comprising a high k dielectric and an interfacial layer. Furthermore, the TiC metal compound of the present invention is a very efficient oxygen diffusion barrier at 1000° C. allowing very aggressive equivalent oxide thickness (EOT) and inversion layer thickness scaling below 14 Å in a p-metal oxide semiconductor (pMOS) device.

In broad terms, the present invention provides a semiconductor structure, i.e., film stack, which comprises:
a semiconductor substrate;
an interfacial layer located on said semiconductor substrate;
a high k dielectric located on said interfacial layer; and
a TiC gate metal located on said high k dielectric.

Additionally, the present invention provides a semiconductor structure that comprises:
a semiconductor substrate, and
a patterned gate region comprising at least an interfacial layer located on a portion of said substrate, a high k dielectric located on said interfacial layer, and a TiC compound metal located on said high gate dielectric.

In addition to the film stack and the semiconductor structure described above, the present invention also provides a method of fabricating a TiC metal compound that comprises:
providing a Ti target and an atmosphere that comprises Ar and a carbon source that is diluted with He; and
sputtering a TiC film from said Ti target in said atmosphere.

The present invention also provides a method of fabricating the semiconductor structure described above in which the inventive process for forming a TiC film is employed. In general terms, the semiconductor structure is formed by first providing a stack comprising a high k dielectric and an interfacial layer on a surface of a substrate; and thereafter forming a TiC film on said stack utilizing the processing steps mentioned above, i.e., by providing a Ti target and an atmosphere that comprises Ar and a carbon source that is diluted with He; and sputtering a TiC film from said Ti target in said atmosphere.

In some embodiments of the present invention, the TiC metal gate can be used alone as the gate electrode, or in conjunction with a Si-containing gate electrode that includes a silicide contact on an upper surface thereof. The later structure is referred to herein as a dual polySi/TiC-containing FET.

It is noted that the term high k dielectric is used throughout the present application to denote an insulator material whose dielectric constant k, is greater than $SiO_2$, e.g., greater than 4.0. Preferably, the high k dielectric has a k that is about 7.0 or greater.

The term "interfacial layer" is used throughout the present application to denote an insulator material that comprises atoms of at least Si or O including, for example, $SiO_2$, and SiON.

DETAILED DESCRIPTION

Figure 1A:
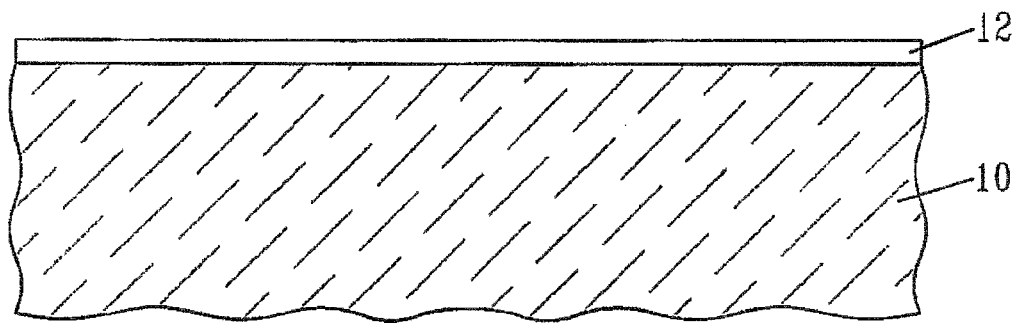
FIGS. 1A-1C are pictorial representations (through cross sectional views) illustrating the various processing steps used in forming a film stack structure which includes the TiC metal compound as a p-type metal gate on a stack comprising a high k dielectric and an interfacial layer.

The present invention, which provides a TiC compound metal that can be used as a thermally stable p-metal gate on a stack comprising a high k dielectric and an interfacial layer as well as a method of fabricating the same, will now be described in greater detail by referring to the drawings that accompany the present application. It is noted that the drawings of the present invention are provided for illustrative purposes and thus they are not drawn to scale.

Figure 1B:
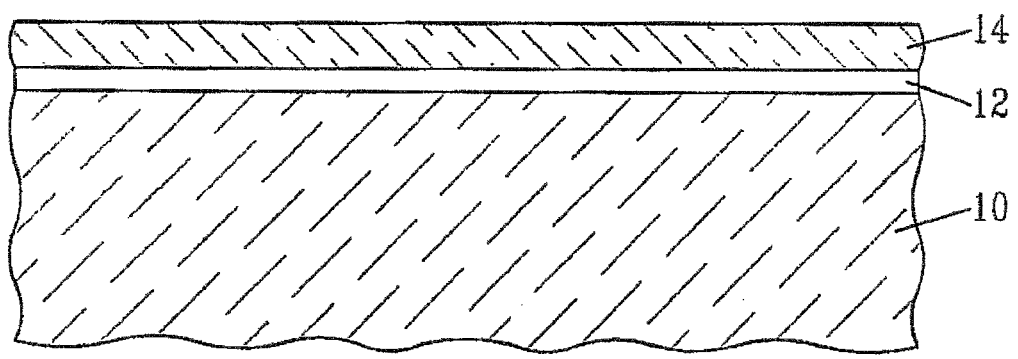
Figure 1C:
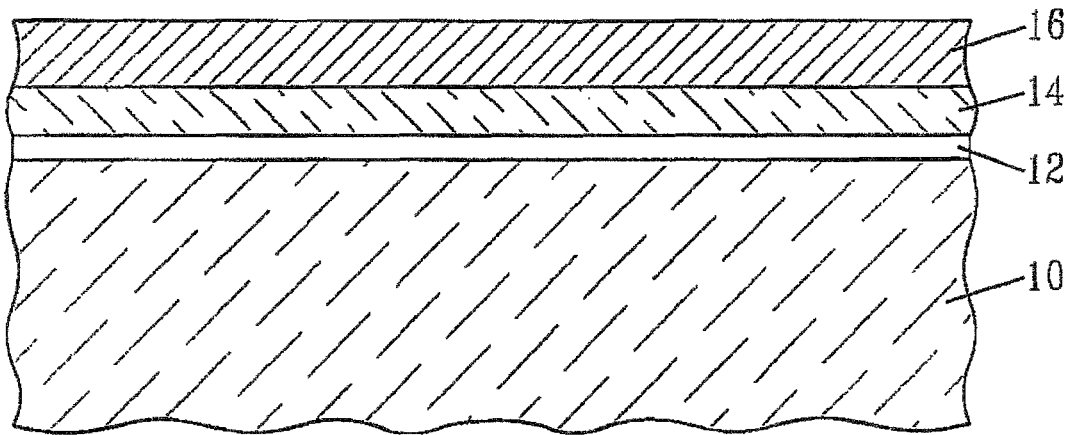

Reference is first made to FIGS. 1A-1C which illustrate basic processing steps that are used in forming a film stack structure that includes the inventive TiC compound metal on a stack containing a high k dielectric and an interfacial layer. FIG. 1A shows an initial film stack structure that includes an interfacial layer 12 on a surface of a semiconductor substrate 10.

The semiconductor substrate 10 employed in the present invention comprises any semiconducting material including, but not limited to: Si, Ge, SiGe, SiC, SiGeC, Ga, GaAs, InAs, InP and all other IV/IV, III/V, or II/VI compound semiconductors. Semiconductor substrate 10 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 10 be composed of a Si-containing semiconductor material, i.e., a semiconductor material that includes silicon. The semiconductor substrate 10 may be doped, undoped or contain doped and undoped regions therein.

The semiconductor substrate 10 may also include a first doped (n- or p-) region, and a second doped (n- or p-) region. For clarity, the doped regions are not specifically shown in the drawings of the present application. The first doped region and the second doped region may be the same, or they may have different conductivities and/or doping concentrations. These doped regions are known as "wells". The semiconductor substrate 10 may be strained, unstrained or a combination thereof. Moreover, the semiconductor substrate 10 may have any crystallographic orientation including, for example, 100, 110, 111 or a combination thereof. Alternatively, the semiconductor substrate 10 may be a hybrid substrate that includes at least two planar surfaces of different crystallographic orientation.

At least one isolation region (not shown) is then typically formed into the semiconductor substrate 10. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities. The neighboring gate regions can have the same conductivity (i.e., both n- or p-type), or alternatively they can have different conductivities (i.e., one n-type and the other p-type).

Interfacial layer 12 is then formed atop the surface of the semiconductor substrate 10 utilizing a thermal process such as oxidation or oxynitridation, a deposition process such as chemical vapor deposition (CVD), plasma-assisted CVD, atomic layer deposition (ALD), evaporation, sputtering, and chemical solution deposition, or a combination thereof. Alternatively, a deposition process and nitridation can be used to form the interfacial layer 12. The interfacial layer 12 comprising atoms of at least Si and O, with N being optional. The interfacial layer 12 thus may comprise SiO$_2$, SiON, silicates thereof, or multilayers thereof. In some embodiments, the interfacial layer 12 comprises SiO$_2$, while in other embodiments the interfacial layer 12 comprises SiON. The interfacial layer 12 comprises from about 1 to about 80, typically from about 1 to about 20, atomic percent Si. The remaining is O and/or N. A chemical oxide is typically used with no N present. The Si can be continuously present throughout the interfacial layer 12 or it can be graded.

The interfacial layer 12 typically has a dielectric constant from about 4.0 to about 20, with a dielectric constant from about 4.5 to about 18 being even more typical. The interfacial layer 12 typically has a thickness from about 0.1 to about 5 nm, with a thickness from about 0.2 to about 2.5 nm being more typical.

Next, and as shown in FIG. 1B, a high k dielectric 14 is formed on a surface of the interfacial layer 12. The term "high k" denotes an insulator whose dielectric constant is greater than 4.0, typically from about 7.0 or greater. The high k dielectric 14 can be formed by a thermal growth process such as, for example, oxidation, nitridation or oxynitridation. Alternatively, the high k dielectric 14 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The dielectric 14 may also be formed utilizing any combination of the above processes.

Illustratively, the high k dielectric 14 employed in the present invention includes, but is not limited to: an oxide, nitride, oxynitride, and/or silicate (including metal silicates and nitrided metal silicates). In one embodiment, it is preferred that the high k dielectric 14 is comprised of an oxide such as, for example, HfO$_2$, ZrO$_2$, Al$_2$O$_3$, TiO$_2$, La$_2$O$_3$, SrTiO$_3$, LaAlO$_3$, Y$_2$O$_3$, Ga$_2$O$_3$, GdGaO and mixtures thereof. Highly preferred examples of the high k dielectric 14 include HfO$_2$, hafnium silicate or hafnium silicon oxynitride.

The physical thickness of the high k dielectric 14 may vary, but typically, the high k dielectric 14 has a thickness from about 0.5 to about 10 nm, with a thickness from about 0.5 to about 3 nm being more typical.

After providing the stacked structure shown in FIG. 1B, a TiC compound metal layer 16 is then formed atop the high k dielectric 14 providing the structure shown, for example, in FIG. 1C. In accordance with the present invention, the TiC compound metal layer 16 is formed by providing a Ti target and an atmosphere that comprises Ar and a carbon source that is diluted with He and then sputtering a TiC film from said Ti target in said atmosphere. In accordance with the present invention, He is used to dilute the C source. The amount of He that can be used to dilute the C source is typically from about 70 to about 99%, more typically from about 90 to about 98%, with an amount of He about 95% being even more typical. The sputtering process occurs in a reactor chamber of any conventional sputtering apparatus.

The Ti target used in the present invention includes any solid source of Ti. The carbon source used in the atmosphere during the sputtering of the TiC film includes any organic containing C compound including for example, alkanes (an organic compound containing a single bond of C such as $CH_4$, $C_2H_6$ and other $C_nH_{2n+2}$ compounds), alkenes (containing a double bond of C such as $C_2H_4$, and other $C_nH_{2n}$ compounds) and alkynes (containing a triple bound of C such as $C_2H_2$). Preferably, the C source is an alkyne, with $C_2H_2$ being most preferred. The source of C can be a solid, liquid or gas, with gaseous C sources being highly preferred.

In some embodiments of the present invention, the flow of Ar and C source diluted with He employed in the present invention is from about 1 to about 100 sccm for Ar and from about 1 to about 100 sccm for C source. More typically, the flow of Ar is about 20 sccm and the flow of He diluted C source is about 16 sccm. The other sputtering conditions such as temperature, gas pressure and time are conventional and are well known to those skilled in the art.

The thickness of the TiC film 16 formed may vary depending on the sputtering conditions used and the type of device to be fabricated. Typically, the TiC film 16 has a thickness, after sputtering, from about 2 to about 200 nm, with a thickness from about 5 to about 50 nm being even more typical.

The structure shown in FIG. 1C can then be formed into a CMOS device, e.g., FET, utilizing any conventional CMOS processing flow. In some embodiments, the stacked structure shown in FIG. 1C can be processed as is, or alternatively, a Si-containing gate material 18 can be formed on top of the TiC layer 16. The later embodiment is shown in FIG. 2A-2D. Although FIGS. 2A-2D illustrate the presence of the Si-containing material 18, the following processing steps generally work when no Si-containing material is formed. Note that the subsequent silicidation of the patterned gate region 20 including only the TiC layer 16 is typically not performed.

Figure 2A:
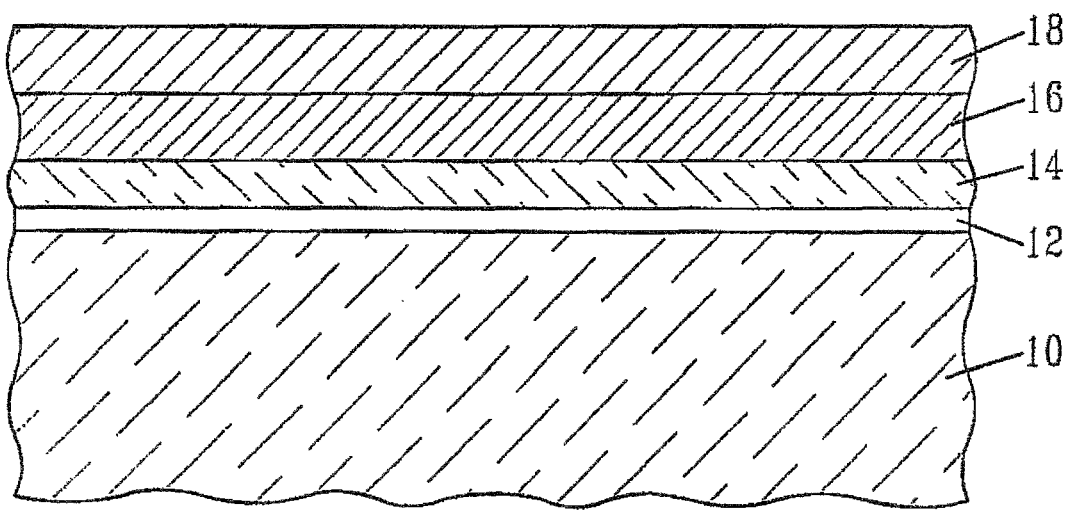
FIGS. 2A-2D are pictorial representations (through cross sectional views) illustrating the basic processing steps of the present invention for forming a polySi/gate metal self-aligned FET structure.

In the embodiment illustrated in FIG. 2A, a Si-containing material 18 such as polysilicon, SiGe and SiGeC is formed atop the TiC layer 16. Thus, in this embodiment the Si-containing material 18 and the TiC layer 16 form a multilayered gate. In another embodiment, the TiC is used as a single metal gate. The Si-containing material 18 used is in either single crystal, polycrystalline or amorphous, or consists of mixtures of such forms.

The Si-containing material is typically doped utilizing an in-situ deposition process or by deposition, ion implantation and annealing. The dopant is a p-type dopant since TiC is a p-type metal. The thickness, i.e., height, of the Si-containing material 18 formed at this point of the present invention may vary depending on the process employed. Typically, the Si-containing material 18 has a vertical thickness from about 20 to about 180 nm, with a thickness from about 40 to about 150 nm being more typical.

Figure 2B:
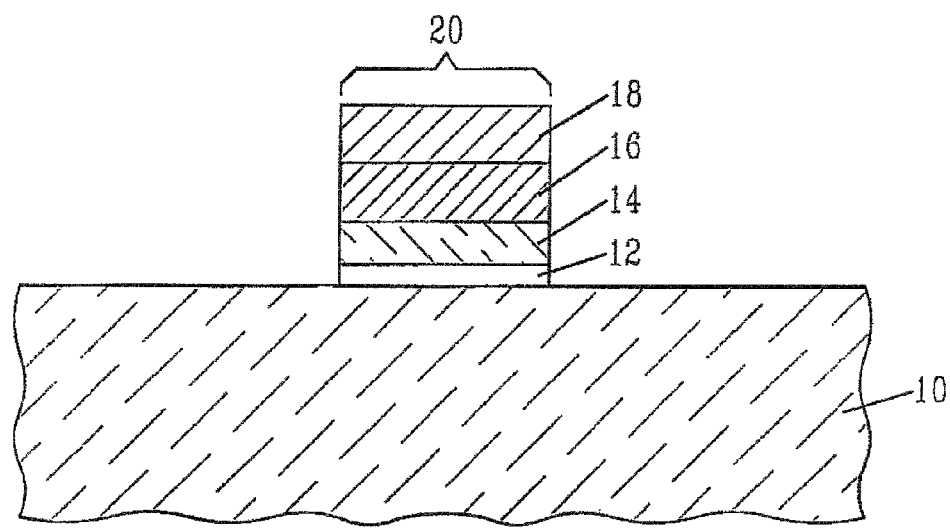

In the processing embodiment illustrated, the Si-containing material 18, the TiC layer 16, and optionally the high k dielectric 14 and the interfacial layer 12 are then patterned by lithography and etching so as to provide a patterned gate region or stack 20. Although a single patterned gate region (or stack) 20 is shown, the present invention contemplates forming a plurality of patterned gate regions (or stacks) 20. When a plurality of patterned gate regions (or stacks) are formed, the gate regions (or stacks) may have the same dimension, i.e., length, or they can have variable dimensions to improve device performance. Each patterned gate stack (or region) 20 at this point of the present invention includes at least a patterned TiC layer 16. FIG. 2B shows the structure after pattern gate region (or stack) 20 formation. In the illustrated embodiment, the Si-containing material 18, the TiC layer 16, the high k dielectric 14 and the interfacial layer 12 are etched, i.e., patterned, during this step of the present invention.

The lithographic step includes applying a photoresist to the upper surface of the blanket layered structure shown in either FIG. 2A or FIG. 1C, exposing the photoresist to a desired pattern of radiation and developing the exposed photoresist utilizing a conventional resist developer. The pattern in the photoresist is then transferred to the structure utilizing one or more dry etching steps. In some embodiments, the patterned photoresist may be removed after the pattern has been transferred into one of the layers of the blanket layered structure. In other embodiments, the patterned photoresist is removed after etching has been completed.

Suitable dry etching processes that can be used in the present invention in forming the patterned gate region (or stack) 20 include, but are not limited to: reactive ion etching, ion beam etching, plasma etching or laser ablation. The dry etching process employed is typically, but not always, selective to the underlying high k dielectric 14 therefore this etching step does not typically remove the stack containing the high k dielectric 14 and the interfacial layer 12. In some embodiments and as shown in FIG. 2B, this etching step may however be used to remove portions of the high k dielectric 14 and the interfacial layer 12 that are not protected by the material layers of the gate region (or stack) that were previously etched.

Figure 2C:
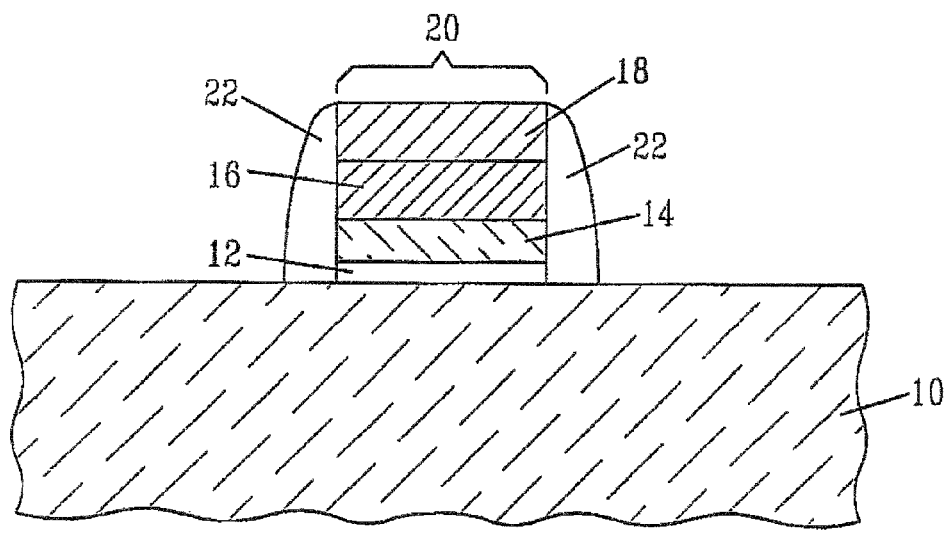

Next, at least one spacer 22 is typically, but not always, formed on exposed sidewalls of each patterned gate region (or stack) 20, see, for example, FIG. 2C. The at least one spacer 22 is comprised of an insulator such as an oxide, nitride, oxynitride and/or any combination thereof. The at least one spacer 22 is formed by deposition and etching.

The width of the at least one spacer 22 must be sufficiently wide such that the source and drain silicide contacts (to be subsequently formed) do not encroach underneath the edges of the gate region (or stack) 20. Typically, the source/drain silicide does not encroach underneath the edges of the gate region (or stack) 20 when the at least one spacer 22 has a width, as measured at the bottom, from about 20 to about 80 nm.

The gate region (or stack) 20 can also be passivated prior to spacer formation by subjecting the same to a thermal oxidation, nitridation or oxynitridation process. The passivation step forms a thin layer of passivating material (not shown) about the gate region (or stack) 20. This step may be used instead or in conjunction with the previous step of spacer formation. When used with the spacer formation step, spacer formation occurs after the gate region (or stack) 20 passivation process.

Source/drain diffusion regions 24 (with or without the spacers present) are then formed into the substrate. The source/drain diffusion regions 24 are formed utilizing ion implantation and an annealing step. The annealing step serves to activate the dopants that were implanted by the previous implant step. The conditions for the ion implantation and annealing are well known to those skilled in the art. The structure formed after ion implantation and annealing is shown in FIG. 2D.

The source/drain diffusion regions 24 may also include extension implant regions (not separately labeled) which are formed prior to source/drain implantation using a conventional extension implant. The extension implant may be followed by an activation anneal, or alternatively the dopants implanted during the extension implant and the source/drain implant can be activated using the same activation anneal cycle. Halo implants (not shown) are also contemplated herein. The source/drain extensions are typically shallower than the deep source/drain regions and they include an edge that is aligned with an edge of the patterned gate region (or stack) 20.

Next, and if not previously removed, the exposed portion of the high k dielectric 14 and the underlying interfacial layer 12 are removed utilizing a chemical etching process that selectively removes these insulating materials. This etching step stops on an upper surface of the semiconductor substrate 10. Although any chemical etchant may be used in removing the exposed portions of the high k dielectric 14 and the underlying interfacial layer 12, in one embodiment dilute hydrofluoric acid (DHF) is used.

Figure 2D:
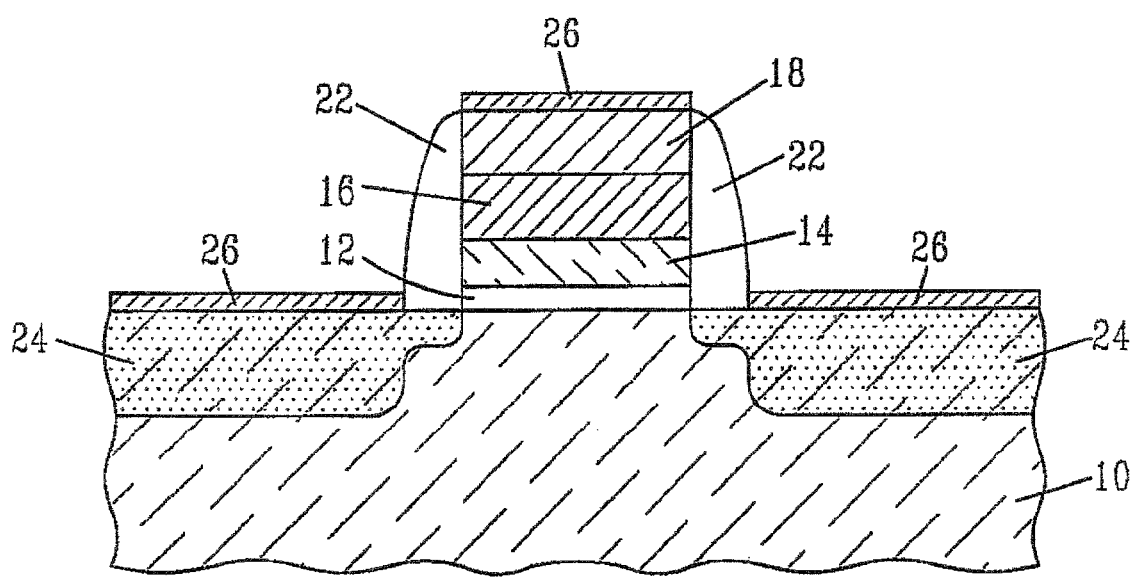

FIG. 2D also shows the presence of silicide regions 26 atop the source/drain diffusion regions 26 and, if present, the Si-containing material 18. The silicide atop the Si-containing material 18 is optional and is not formed if no Si-containing material is present on top of the gate region (or stack 20). The silicide regions 26 are formed utilizing any conventional silicidation process. In some embodiments and when no Si-containing material is present on at least the source/drain regions 26, a Si-containing material, such as epitaxial Si or amorphous Si, can be formed prior to silicidation.

The silicidation process comprises forming a conductive and refractory metal such as Co, Ti, W, Ni, Pt or alloys thereof with other alloying additives, such as C, Ge, Si, and etc., on top of the area to be silicided. A conventional deposition process, such as CVD, PECVD, sputtering, evaporation or plating, can be used. Optionally, a barrier layer may be formed over the metal layer that protects the metal from oxidation. Examples of optional barrier layers include, for example, SiN, TiN, TaN, TiON and combinations thereof. Following metal deposition the structure is subjected to at least a first anneal that causes reaction between the deposited metal and Si and subsequent formation of a metal silicide. The annealing is typically performed at a temperature from about 250° to about 800° C., with a first annealing temperature from about 400° to about 550° C. being more typical.

In some embodiments, the first anneal forms a metal rich silicide phase, which is highly resistant to a selective etch process. When a metal rich phase is produced, a second higher temperature anneal is required to form a low resistivity silicide. In other embodiments, the first anneal is sufficient in forming the low resistivity silicide.

Following the first anneal, the unreacted and remaining portions of the deposited metal are removed using a conventional etch process, such as wet etching, reactive-ion etching (RIE), ion beam etching, or plasma etching.

If needed, a second anneal is performed after the etching process. The second annealing is typically performed at higher temperatures than the first annealing. A typical temperature range for the second, optional, anneal is from about 550° to about 900° C.

Further CMOS processing such as the formation of BEOL (back-end-of-the-line) interconnect levels with metal interconnects can be formed utilizing processing steps that are well known to those skilled in the art.

The following example provides an illustration of the inventive process as well as some advantages that can be obtained from using the same in forming a TiC-containing gate stack.

EXAMPLE

In this example, a TiC/HfO$_2$/SiO$_2$ stack was formed on a surface of a Si wafer. The SiO$_2$ interfacial layer was formed by oxidation of the Si wafer. The thickness of the SiO$_2$ interfacial layer was about 1.2 nm. A HfO$_2$ dielectric having a thickness of about 3 nm was then formed on the SiO$_2$ interfacial layer by MOCVD. The TiC layer was then formed by providing a Ti target and an atmosphere comprising Ar/C$_2$H$_2$ (5% in He) using flow rates of 20 and 16 sccm, respectively. The TiC layer had a thickness of about 40 nm.

Figure 3:
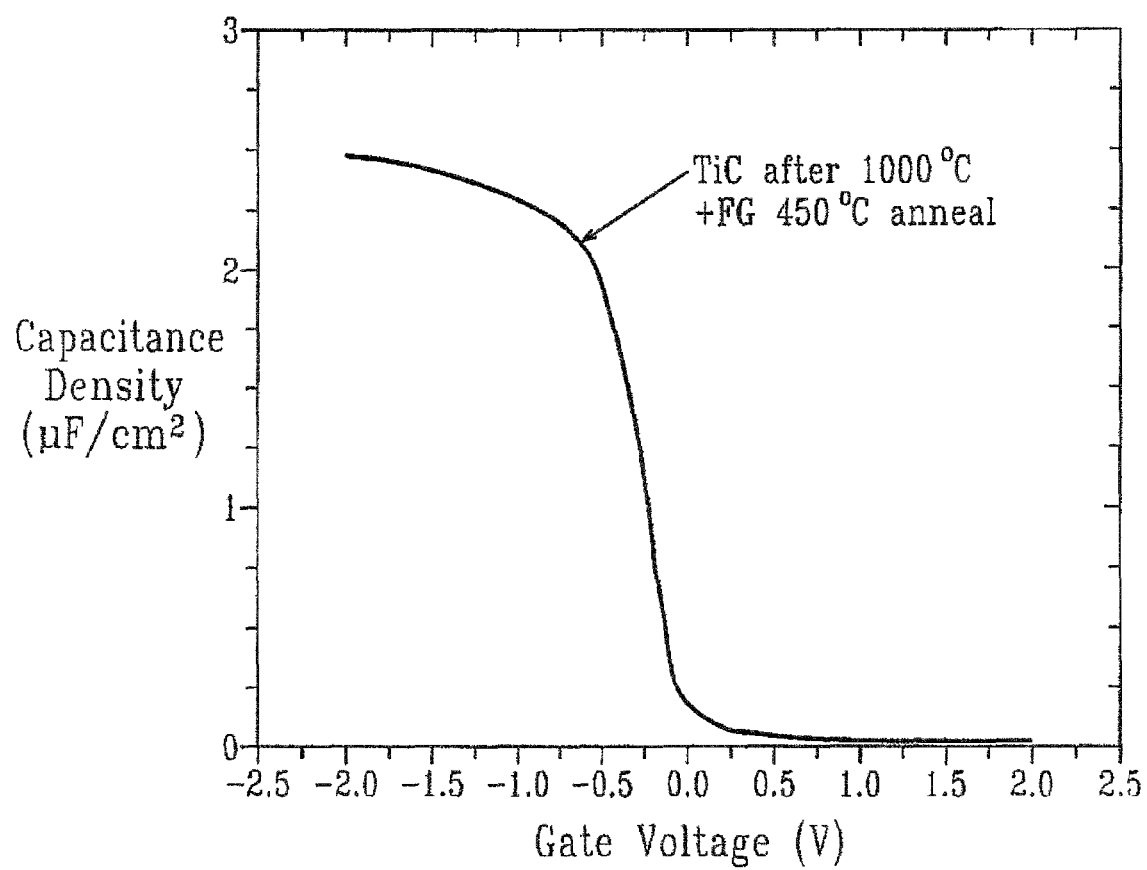
FIG. 3 is a graph showing the capacitance vs. voltage (CV) characteristics of a TiC/HfO$_2$/SiO$_2$ gate stack after annealing at 1000° C. in N$_2$ and then annealing in a forming gas ambient.

After providing the stack, the stack was subjected to a rapid thermal anneal at 1000° C. in N$_2$ and a forming gas at 450° C. anneal was separately performed. FIG. 3 shows the CV characteristics of this stack. The CV was taken at 10 kHz and traced back and forth. The trace shows no hysterisis indicating low charge trapping. The CV characteristic looks ideal indicating low interface states below $1 \times 10^{11}$ charges/cm$^2$. Note that the workfunction for the stack was about 5 eV, as calculated by S. M. Sze, Physics of Semiconductor Devices, Second Edition, pages 395-397, J. Wiley & Sons, which is typical for a pMOS device. Also, notice that the EOT (classical) was only about 14 Å. Thus, the pFET fabricated using this stack should operate at an inversion layer thickness of about 14 Å with substantial gate leakage reduction (~5 orders of magnitude) because of the high k dielectric implemented in the gate stack. Current SiO$_2$, technology has an inversion layer thickness of about 19 Å with a much higher gate leakage.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor device including a TiC metal compound comprising:
   positioning a semiconductor substrate in a reactor chamber, wherein an interfacial layer comprised of SiO$_2$ is present on the substrate and a high-k dielectric layer is present on the interfacial layer;
   providing a Ti target and an atmosphere that comprises Ar and a carbon (C) source that is diluted with He;
   sputtering a TiC film on the high-k dielectric layer from said Ti target in said atmosphere; and
   patterning the TiC film and the high-k dielectric layer to provide a gate structure, wherein the TiC film provides a gate conductor of a p-type semiconductor structure having interface states below $1 \times 10^{11}$ charges/cm$^2$, and having an inversion layer thickness of about 14 Å or less.

2. The method of claim 1 wherein said C source is an alkane, an alkene or an alkyne.

3. The method of claim 2 wherein said C source is an alkyne and is C$_2$H$_2$.

4. The method of claim 1 wherein said C source is a solid, liquid or gas.

5. The method of claim 1 wherein said He is used in an amount from about 70 to about 99% to dilute said C source.

6. The method of claim 1 wherein said Ar is provided at a flow of about 1 to about 100 sccm and said He diluted C source is provided at a flow of about 1 to about 100 sccm.

7. A method of forming a semiconductor structure comprising:
   providing a stack comprising a high k dielectric and an interfacial layer on a surface of a semiconductor substrate;

forming a TiC film on said stack, wherein said TiC film is formed by providing a Ti target and an atmosphere that comprises Ar and a carbon (C) source that is diluted with He;

sputtering a TiC film on the high-k dielectric layer from said Ti target in said atmosphere;

patterning the TiC film and the high-k dielectric layer to provide a gate structure, wherein the TiC film provides a gate conductor of a p-type metal; and forming a source region and a drain region in the semiconductor substrate on opposing sides of the gate structure, wherein the source region and the drain region are doped to a p-type conductivity to provide a p-type semiconductor structure having interface states below $1\times10^{11}$ charges/cm$^2$ and having an inversion layer thickness of about 14 Å or less.

8. The method of claim 7 wherein said C source is an alkane, an alkene or an alkyne.

9. The method of claim 8 wherein said C source is an alkyne and is $C_2H_2$.

10. The method of claim 7 wherein said C source is a solid, liquid or gas.

11. The method of claim 7 wherein said He is used in an amount from about 70 to about 99% to dilute said C source.

12. The method of claim 7 wherein said Ar is provided at a flow of about 1 to about 100 sccm and said He diluted C source is provided at a flow of about 1 to about 100 sccm.

13. The method of claim 7 further comprising forming a Si-containing conductive material atop said TiC film.

14. The method of claim 13 further comprising the step of patterning said Si-containing conductive material, said TiC film and said stack comprising said high k dielectric and said interfacial layer into a patterned gate region.

* * * * *